(12) United States Patent
Dong et al.

(10) Patent No.: US 11,322,714 B2
(45) Date of Patent: May 3, 2022

(54) DISPLAY DEVICE INCLUDING OLED SURROUNDED BY NANOTUBE EXTENDING THROUGH CARRIER, AND MANUFACTURING METHOD THEREOF

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xiaonan Dong, Beijing (CN); Wei Shen, Beijing (CN); Xu Wu, Beijing (CN); Zhonghao Huang, Beijing (CN); Yongliang Zhao, Beijing (CN)

(73) Assignees: CHONGQING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 8 days.

(21) Appl. No.: 16/756,187

(22) PCT Filed: Jan. 3, 2019

(86) PCT No.: PCT/CN2019/070198
§ 371 (c)(1),
(2) Date: Apr. 15, 2020

(87) PCT Pub. No.: WO2019/223332
PCT Pub. Date: Nov. 28, 2019

(65) Prior Publication Data
US 2020/0365822 A1    Nov. 19, 2020

(30) Foreign Application Priority Data
May 22, 2018   (CN) .......................... 201810494065.4

(51) Int. Cl.
*H01L 51/52* (2006.01)
*H01L 51/56* (2006.01)

(52) U.S. Cl.
CPC .......... *H01L 51/5237* (2013.01); *H01L 51/56* (2013.01)

(58) Field of Classification Search
USPC .......................................................... 257/40
See application file for complete search history.

(56) References Cited

U.S. PATENT DOCUMENTS

2005/0088087 A1    4/2005  Ogawa
2007/0159072 A1*   7/2007  Oh ...................... H01L 51/0048
                                                         313/504

(Continued)

FOREIGN PATENT DOCUMENTS

CN    1604154    4/2005
CN    1988204    6/2007

(Continued)

OTHER PUBLICATIONS

Office action from Chinese Application No. 201810494065.4 dated Mar. 19, 2019.

*Primary Examiner* — Matthew E. Gordon
(74) *Attorney, Agent, or Firm* — Calfee, Halter & Griswold LLP (57) ABSTRACT

Disclosed is a display device, a manufacturing method thereof and a display apparatus. The display device includes a carrier having a first surface and a second surface opposite to each other, and at least one nanotube in the carrier. Each nanotube includes a tube wall and a receiving cavity surrounded by the tube wall. The receiving cavity includes a first open end at the first surface and a second open end at the second surface. The display device further includes a first electrode at the first open end, a second electrode at the (Continued)

second open end and a light-emitting layer between the first electrode and the second electrode.

17 Claims, 4 Drawing Sheets

(56) References Cited

U.S. PATENT DOCUMENTS

| | | |
|---|---|---|
| 2007/0210704 A1 | 9/2007 | Park |
| 2010/0003516 A1* | 1/2010 | Majumdar ........ H01L 21/02653 428/368 |
| 2010/0244663 A1 | 9/2010 | Park et al. |

FOREIGN PATENT DOCUMENTS

| | | |
|---|---|---|
| CN | 101035398 | 9/2007 |
| CN | 106338500 | 1/2017 |
| CN | 108711591 | 10/2018 |
| JP | 2000-268704 | 9/2000 |
| JP | 2008-041539 | 2/2008 |

* cited by examiner

DISPLAY DEVICE INCLUDING OLED SURROUNDED BY NANOTUBE EXTENDING THROUGH CARRIER, AND MANUFACTURING METHOD THEREOF

CROSS REFERENCE TO RELATED APPLICATIONS

The present application is a 35 U.S.C. 371 national stage application of a PCT International Application No. PCT/CN2019/070198, filed on Jan. 3, 2019, which claims the benefits of priority of Chinese patent application No. 201810494065.4 filed on May 22, 2018, the entire disclosures of which are incorporated herein by reference.

TECHNICAL FIELD

This disclosure relates to the field of display, and in particular to a display device, a manufacturing method thereof and a display apparatus.

BACKGROUND

Organic light-emitting diode (i.e., OLED) display panels have excellent characteristics such as ultra-thinness, low power consumption, fast response speed, self-luminousness, high contrast, wide angle of view and applicability to flexible panels. A general manufacture process for an OLED display panel involves sequentially depositing an anode, a hole injection layer, a light-emitting layer and a cathode, with a diaphragm having a specified film quality disposed between the pixels, and then encapsulating the OLED display panel. This makes the OLED display panel manufacture process quite complicated, and moreover, the encapsulation material is applied to a large area during the coating, which results in a low utilization rate.

SUMMARY

In an exemplary embodiment, a display device is provided. The display device comprises a carrier comprising a first surface and a second surface opposite to each other, and at least one nanotube in the carrier. Each nanotube of the at least one nanotube comprises a tube wall and a receiving cavity surrounded by the tube wall, the receiving cavity comprises a first open end at the first surface and a second open end at the second surface. The display device further comprises a first electrode at the first open end, a second electrode at the second open end and a light-emitting layer between the first electrode and the second electrode.

In some exemplary embodiments, the first electrode comprises a metal nanowire, the display device further comprises a heterojunction located at a position where the first electrode contacts the tube wall of the nanotube.

In some exemplary embodiments, the display device further comprises an encapsulation film on an outer surface of at least one of the first electrode and the second electrode.

In some exemplary embodiments, one of the first open end and the second open end of the receiving cavity comprises a light exit hole.

In some exemplary embodiments, a refractive index of the tube wall of the nanotube is greater than a refractive index of the carrier.

In some exemplary embodiments, a height of the receiving cavity is equal to a sum of a height of the first electrode and a height of the light-emitting layer.

In some exemplary embodiments, the nanotube comprises a titanium dioxide nanotube.

In some exemplary embodiments, the at least one nanotube is arranged in an array in the carrier.

In another exemplary embodiment, a method for manufacturing a display device is provided, the method comprising: providing a carrier, the carrier comprising a first surface and a second surface opposite to each other; forming at least one nanotube in the carrier, each nanotube of the at least one nanotube comprising a tube wall and a receiving cavity surrounded by the tube wall, the receiving cavity comprising a first open end at the first surface and a second open end at the second surface; forming a first electrode at the first open end of the receiving cavity; adsorbing a liquid material for forming a light-emitting layer into the receiving cavity via the second open end of the receiving cavity, and forming a second electrode at the second open end of the receiving cavity.

In some exemplary embodiments, the liquid material for forming the light-emitting layer is adsorbed into the receiving cavity by means of capillarity.

In some exemplary embodiments, the forming the first electrode at the first open end of the receiving cavity comprises: modifying a first portion of the tube wall such that negative charges are adsorbed onto an inner side of the first portion, the first portion being located at the first open end of the receiving cavity; bringing the first portion of the tube wall into contact with a metal salt solution such that the metal salt solution is adsorbed onto the inner side of the first portion by capillarity, and evaporating the metal salt solution such that metal cations in the metal salt solution are adsorbed onto the inner side of the first portion and react with the negative charges, thereby forming the first electrode.

Yet another exemplary embodiment of the disclosure provides a display apparatus comprising the display device according to any one of the foregoing embodiments.

Other features and advantages of the disclosure will be specifically illustrated in the subsequent description and they will become apparent from the description, or they can be well understood by implementing the disclosure. Objectives and other advantages of the disclosure can be realized and achieved by features specially described in the description, the claims and the drawings.

BRIEF DESCRIPTION OF DRAWINGS

The drawings are used to provide further understanding of the technical solutions in the disclosure and constitute part of the specification. Besides, the drawings are used to explain the technical solutions in this disclosure together with the embodiments, but they cannot limit the technical solutions in this disclosure in any sense.

DETAILED DESCRIPTION

In order to render the goals, the technical solutions and the advantages of this disclosure clearer, exemplary embodiments of this disclosure will be explained in detail with reference to the drawings. It should be noted that, the embodiments of the present application and the features of the embodiments can be arbitrarily combined if no conflict is caused.

Figure 1:
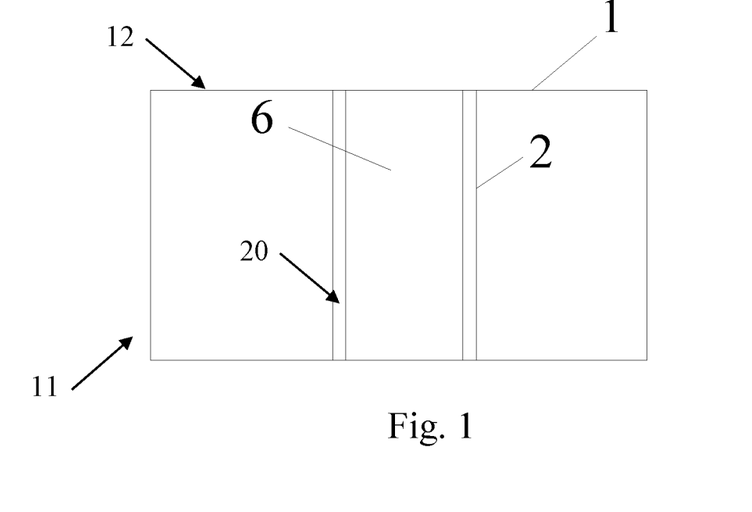
FIG. 1 illustrates a section view of a nanotube in the display device according to an exemplary embodiment.

The disclosure provides a display device. Referring to FIG. 1, a section view of the display device (in particular, a nanotube in the display device) according to an embodiment of this disclosure is shown schematically. Specifically, the display device comprises a carrier 1 and at least one nanotube 2, particularly a nanotube 2 as shown in FIG. 1, formed in the carrier 1. Besides, the carrier 1 comprises an upper surface and a lower surface, i.e., a first surface 11 and a second surface 12, and the nanotube 2 comprises a tube wall 20 and a receiving cavity 6 surrounded by the tube wall 20. Moreover, the nanotube 2 comprises a first open end located on the first surface 11 and a second open end located on the second surface 12, i.e., the upper end and the lower end shown in FIG. 1. Furthermore, referring to FIG. 2, a full section view of the display device according to an exemplary embodiment is illustrated. As can be seen from FIG. 2, in the receiving cavity 6, a first electrode 3, a light-emitting layer 5 and a second electrode 4 are arranged sequentially from bottom to top. The first electrode 3 is encapsulated at a lower open end of the receiving cavity 6, and the second electrode 4 is encapsulated at an upper open end of the receiving cavity 6, and the light-emitting layer 5 is between the first electrode 3 and the second electrode 4.

Figure 2:
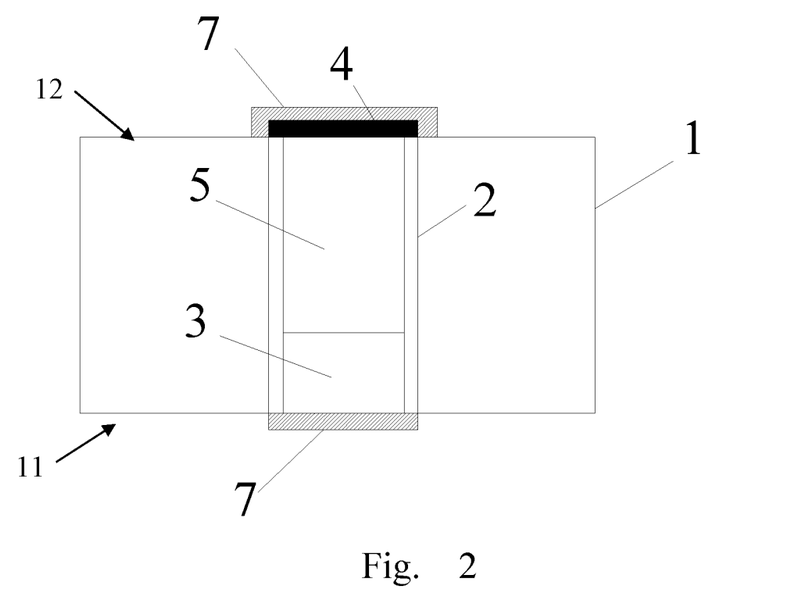
FIG. 2 illustrates a section view of the display device according to an exemplary embodiment.

In the display device shown in FIG. 1 and FIG. 2, the carrier 1 may be made of a semiconductor material such as a metal semiconductor, a metal oxide semiconductor or sulfide conductor. In some exemplary embodiments, the carrier 1 may be made of a metal oxide semiconductor such as a zinc oxide, a tin oxide, an iron oxide, a tungsten oxide or a cadmium oxide. Alternatively, the carrier 1 may be made of a sulfide semiconductor material such as a zinc sulfide or a tin disulfide.

Figure 3:
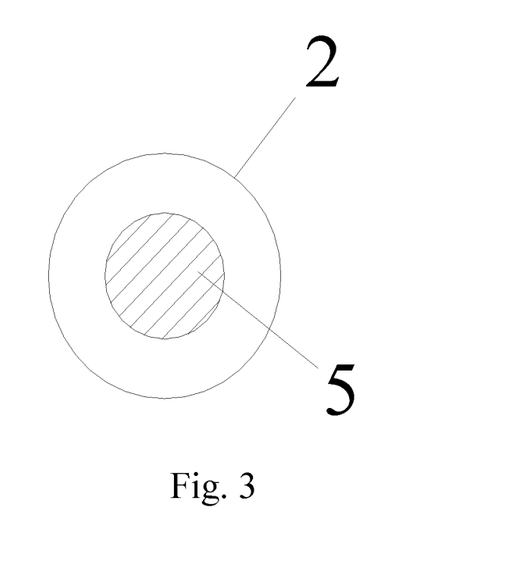
FIG. 3 illustrates a top view of a nanotube in the display device according to an exemplary embodiment.

According to an exemplary embodiment, in the display device shown in FIG. 1, FIG. 2 and FIG. 3, the nanotube 2 may be a semiconductor nanotube. Furthermore, the nanotube 2 may be made of a semiconductor material such as a metal oxide semiconductor or sulfide conductor. For instance, the nanotube 2 is a titanium dioxide nanotube.

According to an exemplary embodiment, in the display device shown in FIG. 1, FIG. 2 and FIG. 3, as an example, the first electrode 3 may be a cathode and the second electrode 4 may be an anode. In this case, the first electrode 3 and the light-emitting layer 5 may be stacked in the receiving cavity 6, the light-emitting layer 5 comprises an electroluminescent material. Thereby, the first electrode 3 is located at an end of the receiving cavity and encapsulates this end of the receiving cavity 6. Alternatively, it is ensured that a height of the receiving cavity 6 is the same as the sum of heights of the first electrode 3 and the light-emitting layer 5. Of course, in some other exemplary embodiments, the height of the receiving cavity 6 may be greater than the sum of the heights of the first electrode 3 and the light-emitting layer 5.

According to an exemplary embodiment, the first electrode 3 may be made of a metal nanowire. For example, the first electrode 3 may comprise silver nanowire. In this way, an outer wall of the metal nanowire may be brought into contact with an inner wall of the nanotube 2, with a heterojunction formed between the outer wall and the inner wall. As can be known from the theory of semiconductor, once a heterojunction is formed, it will produce a work function difference that distinguishes it from a single metal, thereby promoting charge transference. When the display device works normally, it is necessary to apply a voltage to the first electrode 3 and the second electrode 4. As an example, the first electrode 3 is externally connected to a negative voltage, and the second electrode 4 is externally connected to a positive voltage. Therefore, when the first electrode 3 and the second electrode 4 remain energized, the heterojunction will promote the injection of electrons on the first electrode 3, thereby indirectly affecting the lighting efficiency of the display device. Exemplarily, the first electrode 3 may serve as an anode, and the second electrode 4 may serve as a cathode.

As shown in FIG. 2, as another example, an encapsulation film 7 may be provided on an outer surface of the first electrode 3 and/or the second electrode 4 of the display device. In this way, the first electrode 3 and/or the second electrode 4 can be encapsulated by the encapsulation film 7, which protects the first electrode 3 and/or the second electrode 4 against interference from the outside.

Continuously referring to FIG. 1 and FIG. 2, at the upper opening of the receiving cavity 6, the second electrode 4 is encapsulated, and the second electrode 4 and the light-emitting layer 5 are kept in contact with each other. As an example, the second electrode 4 may be coated at the upper opening of the receiving cavity 6 by a magnetron sputtering process, and superimposed on the light-emitting layer 5 in the receiving cavity 6. When the height of the receiving cavity 6 is greater than the sum of the heights of the first electrode 3 and the light-emitting layer 5, part of the second electrode 4 will fill the rest space of the receiving cavity 6 such that the second electrode 4 can be brought into contact with the light-emitting layer 5. Alternatively, if the height of the receiving cavity 6 is equal to the sum of the heights of the first electrode 3 and the light-emitting layer 5, the second electrode 4 will cover the upper opening of the receiving cavity 6 and remain in contact with the light-emitting layer 5.

Referring to FIG. 1 or FIG. 2, in an optional exemplary embodiment, the upper opening or the lower opening of the nanotube 2 may serve as a light exit hole of the display device. For instance, in some exemplary embodiments, the light exit hole is located at the opening of the nanotube 2 close to the second electrode 4, i.e., at the upper opening. In this case, the second electrode 4 is a transparent electrode, and light emitted from the light-emitting layer 5 passes through the second electrode 4. In some exemplary embodiments, the light exit hole may be located at the opening of the nanotube 2 close to the first electrode 3, i.e., at the lower opening. For this case, the first electrode 3 may be a metal nanowire allowing passage of light, and the light emitted from the light-emitting layer 5 passes through the first electrode 3.

According to an exemplary embodiment, for the display device shown in FIG. 1 or FIG. 2, a refractive index of a tube wall 20 of the nanotube 2 may be greater than that of the carrier 1. In this case, when the light emitted from the light-emitting layer 5 diffusely impinges on the tube wall of the nanotube 2, total reflection at the interface between the nanotube 2 and the carrier 1 will occur. Therefore, the light will arrive at the light exit hole by means of total reflection, and finally be emitted out of the light exit hole. Such a design of refractive index can help to converge the light emitted from the light-emitting layer 5, thereby improving the concentration of light emitted from the light-emitting layer 5.

Figure 4:
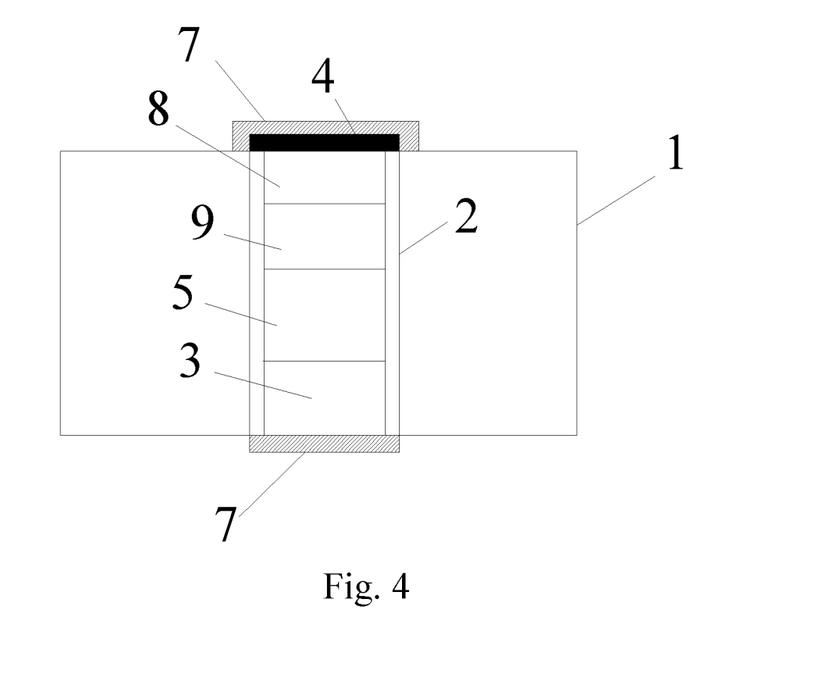
FIG. 4 illustrates a section view of the display device according to an exemplary embodiment.

Referring to FIG. 4, a section view of the display device according to an exemplary embodiment is shown schematically. As shown in FIG. 4, in an optional exemplary embodiment, the display device may further comprise a hole injection layer 8 and a hole transport layer 9. The hole injection layer 8 and the hole transport layer 9 are arranged within the receiving cavity 6, and located between the second electrode 4 and the light-emitting layer 5. Specifically, the hole injection layer 8 is located within the receiving cavity 6 and close to the second electrode 4, and the hole transport layer 9 is located within the receiving cavity 6 and close to the light-emitting layer 5.

Figure 5:
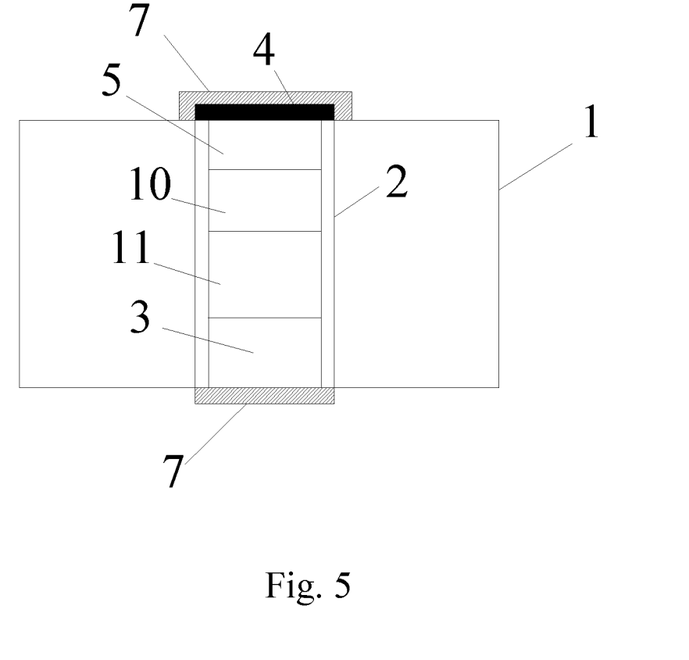
FIG. 5 illustrates a section view of the display device according to an exemplary embodiment.

Referring to FIG. 5, a section view of the display device according to an exemplary embodiment is shown schematically. As shown in FIG. 5, in an optional exemplary embodiment, the display device may further comprise an electron transport layer 10 and an electron injection layer 11. The electron transport layer 10 and the electron injection layer 11 are arranged within the receiving cavity 6, and located between the light-emitting layer 5 and the first electrode 3. Specifically, the electron transport layer 10 is located within the receiving cavity 6 and close to the light-emitting layer 5, and the electron injection layer 11 is located within the receiving cavity 6 and close to the first electrode 3.

According to some exemplary embodiments, in the receiving cavity 6 of the display device, functional film layers such as the hole transport layer 9, the hole injection layer 8, the electron injection layer 11 and the electron transport layer 10 can be combined arbitrarily, and superimposed on the light-emitting layer 5 between the first electrode 3 and the second electrode 4, which will not be detailed herein for simplicity.

Figure 6:
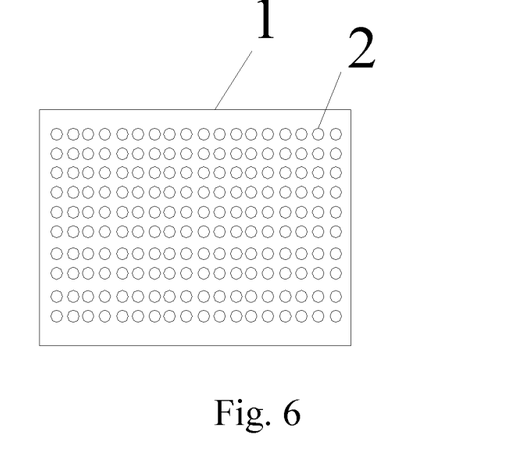
FIG. 6 illustrates a top view of the display device according to an exemplary embodiment.

Referring to FIG. 6, a top view of the display device according to an exemplary embodiment is illustrated. As shown in FIG. 6, the carrier 1 may comprise at least two nanotubes 2, and a plurality of nanotubes 2 are arranged in an array in the carrier 1, thereby forming a nanotube set. For example, in case the carrier 1 is formed from a titanium metal material, titanium dioxide nanotubes can be formed in an array on the carrier 1 by means of an anodization method or a template method. The specific process for preparing nanotubes 2 by using an anodization method may comprise: placing an anode made of a titanium foil and a cathode made of graphite in a solution that has already been prepared, and applying a certain voltage to the electrodes such that a titanium dioxide nanotube array is formed in the titanium foil after a series of reactions.

Figure 7:
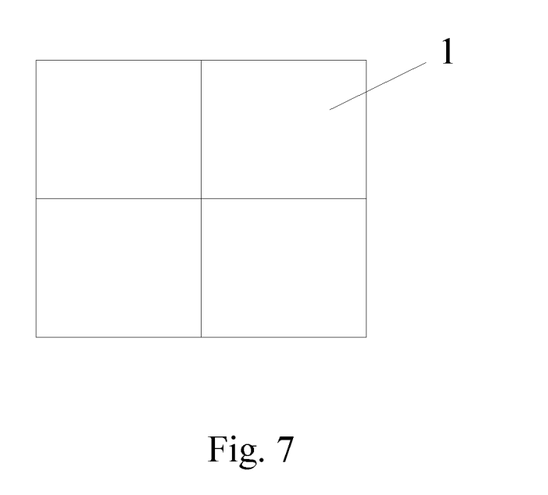
FIG. 7 illustrates a top view of a carrier in the display device according to an exemplary embodiment.
Figure 8:
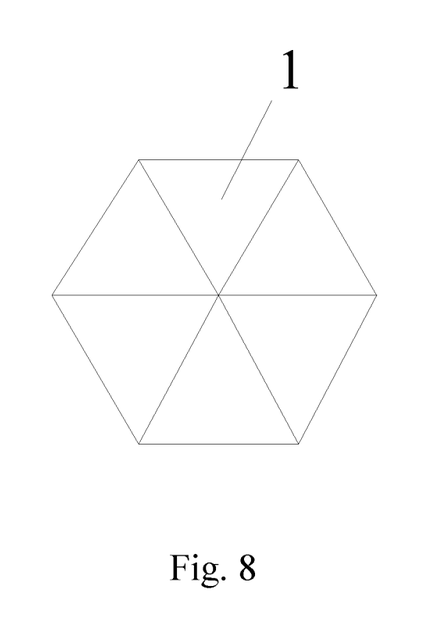
FIG. 8 illustrates a top view of a carrier in the display device according to an exemplary embodiment.

Referring to FIG. 7 and FIG. 8, a top view of a carrier in the display device according to some exemplary embodiments are shown. As can be seen, the carrier 1 may be in a form of a sheet, which may have a shape of triangle, square, rectangle, rhombus, ellipse, hexagon and so on, or other shapes, and a plurality of carriers 1 with same or different shapes may also be combined. After a nanotube set with a certain density is formed on the carrier 1, an OLED may be manufactured on the carrier. As compared with an OLED having a single nanotube, an OLED having a nanotube set has better optical characteristics. Theoretically, an OLED having a nanotube set may serve as a single pixel of a display apparatus. Depending upon different lighting needs, different carriers 1 may be pieced up to form a nanotube set having specified shapes and specified lighting characteristics.

According to another exemplary embodiment, a display apparatus is provided, comprising the display device according to any of the above embodiments.

According to yet another exemplary embodiment, a manufacturing method for a display device is further provided. The manufacturing method may comprise the following steps.

Step I: providing a carrier 1 having a first surface 11 and a second surface 12 opposite to each other, and forming a plurality of nanotubes 2 in an array on the carrier 1 by means of e.g. an anodization method or a template method. Each nanotube 2 comprises a tube wall 20 and a receiving cavity 6 surrounded by the tube wall, and the receiving cavity 6 comprises a first open end on the first surface 11 and a second open end on the second surface 12.

Step II: forming a first electrode 3 at the first open end of the receiving cavity 6, for example, the first electrode 3 may be encapsulated at the first open end of the receiving cavity 6.

Step III: adsorbing a liquid material for forming a light-emitting layer 5 into the receiving cavity 6 via the second open end of the receiving cavity 6 by means of a method such as capillarity; and Step IV: forming a second electrode 4 at the second open end of the receiving cavity 6, thereby forming a display device.

According to an optional embodiment, the tube wall 20 of each nanotube 2 comprises a first portion at the first open end of the receiving cavity 6, and the step of forming a first electrode 3 at the first open end of the receiving cavity 6 comprises the following sub-steps: modifying the first portion of the tube wall 20 with a surfactant such that negative charges are adsorbed onto an inner side of the first portion; bringing the first portion of the tube wall 20 into contact with a metal salt solution such that the metal salt solution penetrate to the inner side of the first portion by capillarity; and evaporating the metal salt solution such that metal cations in the metal salt solution are adsorbed onto the inner side of the first portion and react with the negative charges, thereby forming the first electrode 3.

Specifically, as an example, the first electrode 3 comprises a silver nanowire, and the carrier 1 is in a form of a foil comprising a titanium dioxide nanotube set. In this case, the step of forming a first electrode 3 at the first open end of the receiving cavity 6 may comprise the following steps.

Step I: preparing a 0.5-2 g/L polyvinylpyrrolidone solution and placing it in a vacuum-dryable container, and fixing a foil having a titanium dioxide nanotube set at a certain height within the polyvinylpyrrolidone solution. This ensures that the upper surface of the entire foil is not immersed under the liquid level of the polyvinylpyrrolidone solution such that the polyvinylpyrrolidone solution is adsorbed onto one end of the receiving cavity 6 of each titanium dioxide nanotube. In a vacuum condition, the container is heated and kept at a fixed temperature of 20-60° C. Furthermore, the container is depressurized and dried for 6-36 h such that the end of the titanium dioxide nanotube is modified, i.e., negative charges are collected onto the inner side of the tube wall 20 at the end of the receiving cavity 6 of the titanium dioxide nanotube.

Step II: preparing a 1-20 g/L silver nitrate solution or silver ammonia solution, sealing the silver nitrate solution or silver ammonia solution, and storing it in a vacuum dark room. Furthermore, the foil prepared in the above step I is fixed above the silver nitrate solution or silver ammonia solution, and the modified portion of the titanium dioxide nanotube is brought into contact with the liquid level of the silver nitrate solution or silver ammonia solution. Therefore, the silver nitrate solution or silver ammonia solution is adsorbed onto the inner side of the tube wall 20 at one end of the receiving cavity 6. Next, in a vacuum condition, the container is heated and kept at a fixed temperature of 20-60° C. Furthermore, it is depressurized and dried for 6-36 h. With the evaporation of the silver nitrate solution or silver ammonia solution, silver ions are gradually adsorbed onto the inner side of the tube wall 20 at the end of the receiving cavity 6 of the titanium dioxide nanotube, thereby reacting with the negative charges previously mentioned and forming a silver nanowire. Finally, the silver nanowire can serve as the first electrode 3.

With the adsorption of silver ions, the liquid level of the silver nitrate solution or silver ammonia solution will drop, and after the vacuum drying is completed, a titanium dioxide nanotube set is obtained, each titanium dioxide nanotube is provided with silver nanowires.

In the display device provided in some exemplary embodiments, a first electrode 3, a light-emitting layer 5, a hole transport layer 9 and a hole injection layer 8 are arranged sequentially in a stack in the receiving cavity 6. A liquid material for forming the light-emitting layer 5 is injected into the receiving cavity 6 through adsorption, which may be accomplished by the capillarity of the nano-sized pores of the receiving cavity 6. In this way, the liquid material for forming the light-emitting layer 5 can be adsorbed into the receiving cavity 6 automatically. After the liquid material for forming the light-emitting layer 5 is injected through adsorption, the hole injection layer 8 and the hole transport layer 9 can be injected respectively in a similar way by means of the difference in vacuum. That is, firstly, the nanotubes 2 are placed under high vacuum and pre-evacuated, and then the nanotubes 2 are transferred to a low vacuum atmosphere. In this way, the injection of the hole injection layer 8 and the hole transport layer 9 can be realized by means of the difference in the vacuum.

In the display device provided in some exemplary embodiments, a first electrode 3, an electron injection layer 11, an electron transport layer 10 and a light-emitting layer 5 are arranged sequentially in a stack in the receiving cavity 6. In this case, the electron transport layer 10 and the electron injection layer 11 can be injected by means of the difference in vacuum, and the liquid material for forming the light-emitting layer 5 can be injected by the capillarity of the nano-sized pores of the receiving cavity 6.

As compared with a conventional technical solution, the display device according to the exemplary embodiments herein can achieve beneficial effects as follows.

On one hand, in the display device provided in the exemplary embodiments, one end of the receiving cavity of the nanotube is encapsulated by means of the first electrode, and the liquid material for forming the light-emitting layer is adsorbed into the receiving cavity via the other end of the receiving cavity by capillarity. After that, the opening of the other end of the receiving cavity is encapsulated by means of the second electrode such that the first electrode, the second electrode and the tube wall of the nanotube are combined to form an encapsulation structure for encapsulating the light-emitting layer, thereby achieving self-encapsulation. Besides, such a solution can further save the encapsulation materials and reduce the manufacture costs to the greatest extent.

On the other hand, in the manufacturing method for a display device provided in the exemplary embodiments herein, negative charges are accumulated on the inner side of the tube wall of the nanotube, and then a certain volume of metal salt solution is further adsorbed onto the inner side of the tube wall by capillarity such that the metal cations in the metal salt solution can react with negative charges to form a metal nanowire. The silver nanowire can serve as the first electrode. In this way, the first electrode can be mounted in the receiving cavity conveniently, and the effective encapsulation of the receiving cavity is also ensured. Additionally, the metal nanowire has good conductive properties and excellent mechanical performances, which can help to enhance the charge transfer in the semiconductor and improve the comprehensive mechanical performances of the nanotubes.

Although various exemplary embodiments are described in the disclosure, they are only for facilitating understanding of the disclosure rather than limiting this disclosure. Any skilled person in this art can make any modification or change in forms and details of the embodiments without departing from the spirit revealed herein. The protection scope of the application should be subject to the appended claims.

The invention claimed is:

1. A display device, comprising:
  a carrier comprising a first surface and a second surface opposite to each other, the carrier comprising a first semiconductor material; and
  at least one nanotube in the carrier, the at least one nanotube comprising a second semiconductor material and surrounded by the first semiconductor material of the carrier,
  wherein each nanotube of the at least one nanotube comprises a tube wall and a receiving cavity surrounded by the tube wall, the receiving cavity comprises a first open end at the first surface and a second open end at the second surface,
  wherein the display device further comprises a first electrode at the first open end, a second electrode at the second open end and a light-emitting layer between the first electrode and the second electrode,
  wherein the first electrode comprises a metal nanowire, the display device further comprises a heterojunction located at a position where the first electrode contacts the tube wall of the at least one nanotube,
  wherein the tube wall directly contacts the first semiconductor material of the carrier and extends between the first surface and the second surface of the carrier, and
  wherein a refractive index of the tube wall of the at least one nanotube is greater than a refractive index of the carrier.

2. The display device according to claim 1, wherein the display device further comprises an encapsulation film on an outer surface of at least one of the first electrode and the second electrode.

3. The display device according to claim 1, wherein one of the first open end and the second open end of the receiving cavity comprises a light exit hole.

4. The display device according to claim 1, wherein a height of the receiving cavity is equal to a sum of a height of the first electrode and a height of the light-emitting layer.

5. The display device according to claim 1, wherein the at least one nanotube comprises a titanium dioxide nanotube.

6. The display device according to claim 1, wherein the at least one nanotube is arranged in an array in the carrier.

7. A method for manufacturing the display device according to claim 1, comprising:
provid ing the carrier, the carrier comprising the first surface and the second surface opposite to each other;
forming the at least one nanotube in the carrier, each nanotube of the at least nanotube comprising the tube wall and the receiving cavity surrounded by the tube wall, the receiving cavity comprising the first open end at the first surface and the second open end at the second surface;
forming the first electrode at the first open end of the receiving cavity;
adsorbing a liquid material for forming the light-emitting layer into the receiving cavity via the second open end of the receiving cavity, and
forming the second electrode at the second open end of the receiving cavity.

8. The method according to claim 7, wherein the liquid material for forming the light-emitting layer is adsorbed into the receiving cavity by means of capillarity.

9. The method according to claim 7, wherein the forming the first electrode at the first open end of the receiving cavity comprises:
modifying a first portion of the tube wall such that negative charges are adsorbed onto an inner side of the first portion, the first portion being located at the first open end of the receiving cavity;
bringing the first portion of the tube wall into contact with a metal salt solution such that the metal salt solution is adsorbed onto the inner side of the first portion by capillarity, and
evaporating the metal salt solution such that metal cations in the metal salt solution are adsorbed onto the inner side of the first portion and react with the negative charges, thereby forming the first electrode.

10. A display apparatus comprising the display device according to claim 1.

11. The display apparatus according to claim 10, wherein the first electrode comprises a metal nanowire, the display device further comprises a heterojunction located at a position where the first electrode contacts the tube wall of the at least one nanotube.

12. The display apparatus according to claim 10, wherein the display device further comprises an encapsulation film on an outer surface of at least one of the first electrode and the second electrode.

13. The display apparatus according to claim 10, wherein one of the first open end and the second open end of the receiving cavity comprises a light exit hole.

14. The display apparatus according to claim 13, wherein a refractive index of the tube wall of the at least one nanotube is greater than a refractive index of the carrier.

15. The display apparatus according to claim 10, wherein a height of the receiving cavity is equal to a sum of a height of the first electrode and a height of the light-emitting layer.

16. The display apparatus according to claim 10, wherein the at least one nanotube comprises a titanium dioxide nanotube.

17. The display apparatus according to claim 10, wherein the at least one nanotube is arranged in an array in the carrier.

* * * * *

UNITED STATES PATENT AND TRADEMARK OFFICE
CERTIFICATE OF CORRECTION

PATENT NO. : 11,322,714 B2  
APPLICATION NO. : 16/756187  
DATED : May 3, 2022  
INVENTOR(S) : Xiaonan Dong et al.

Page 1 of 1

It is certified that error appears in the above-identified patent and that said Letters Patent is hereby corrected as shown below:

On the Title Page

Item (73), first Assignee should read as follows:  
---CHONGQING BOE OPTOELECTRONICS TECHNOLOGY CO., LTD., Chongqing (CN)---

Signed and Sealed this  
Fourth Day of July, 2023

Katherine Kelly Vidal  
*Director of the United States Patent and Trademark Office*